(12) United States Patent
Wang et al.

(10) Patent No.: US 7,185,036 B1
(45) Date of Patent: Feb. 27, 2007

(54) LOOK UP TABLE BASED UPSAMPLING AND DIGITAL FILTERING

(75) Inventors: Yi-Hsiu Wang, Union City, CA (US); John Thomson, Union City, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 633 days.

(21) Appl. No.: 10/139,654

(22) Filed: May 3, 2002

(51) Int. Cl.
*G06F 7/38* (2006.01)

(52) U.S. Cl. ..................................... 708/290

(58) Field of Classification Search ........ 708/300–323, 708/290
See application file for complete search history.

(56) References Cited

U.S. PATENT DOCUMENTS

| | | | | |
|---|---|---|---|---|
| 4,887,306 A | * | 12/1989 | Hwang et al. | 708/320 |
| 5,117,385 A | * | 5/1992 | Gee | 708/319 |
| 5,706,219 A | * | 1/1998 | Ishimoto | 708/313 |
| 5,838,725 A | * | 11/1998 | Gurusami et al. | 708/319 |
| 6,256,653 B1 | * | 7/2001 | Juffa et al. | 708/209 |
| 6,337,878 B1 | * | 1/2002 | Endres et al. | 708/322 |
| 6,487,190 B1 | * | 11/2002 | Regis | 708/319 |
| 6,539,064 B1 | * | 3/2003 | Ellis et al. | 708/322 |
| 6,640,237 B1 | * | 10/2003 | Genrich | 708/440 |
| 6,850,579 B2 | * | 2/2005 | Lim et al. | 708/313 |
| 7,007,052 B2 | * | 2/2006 | Jiang et al. | 708/270 |

\* cited by examiner

*Primary Examiner*—Kakali Chaki
*Assistant Examiner*—Chat C. Do
(74) *Attorney, Agent, or Firm*—Van Pelt, Yi & James LLP

(57) ABSTRACT

A system and method are disclosed for processing a signal that includes receiving encoded data including a plurality of input symbols; generating an input symbol set from the plurality of input symbols; looking up a plurality of output samples for the input symbol set; and outputting the plurality of output samples.

32 Claims, 10 Drawing Sheets

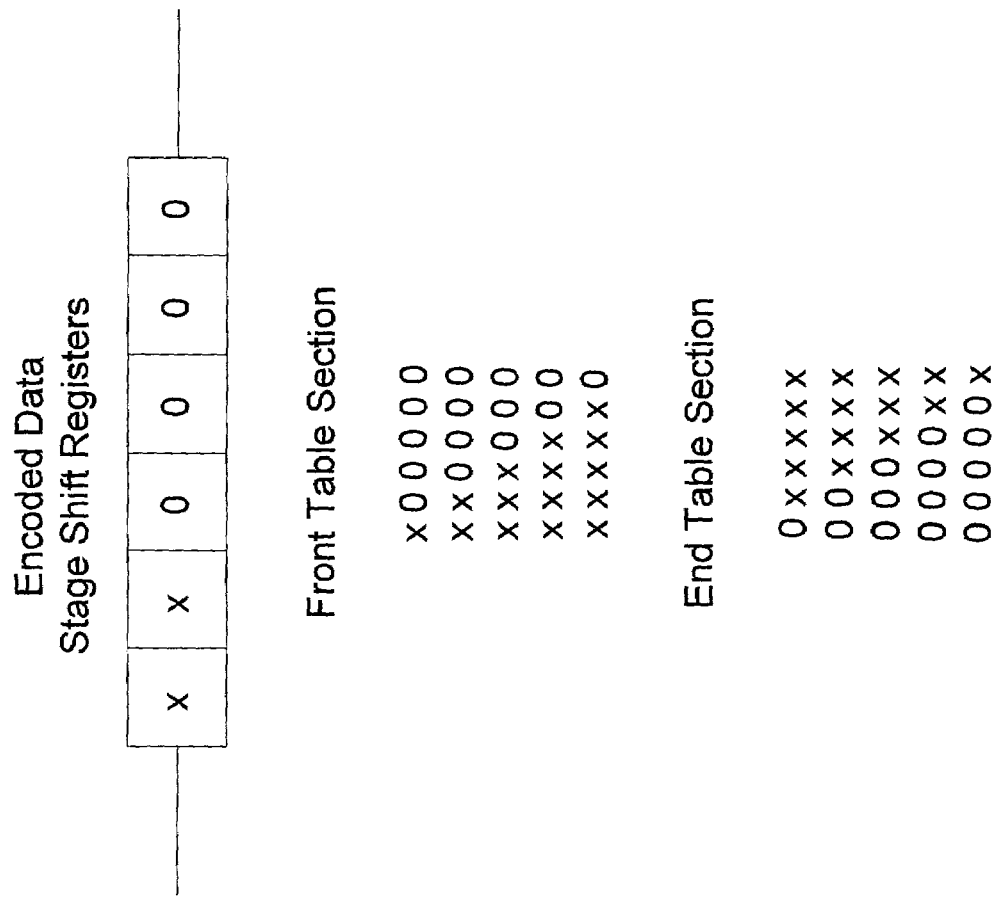

LOOK UP TABLE BASED UPSAMPLING AND DIGITAL FILTERING

FIELD OF THE INVENTION

The present invention relates generally to signal processing. More specifically, the invention relates to a digital filter.

BACKGROUND OF THE INVENTION

In modern communication systems, it is important to be spectrally efficient so that different channels can operate at the same time on closely spaced frequency bands without interfering with each other. To keep interference to the minimum, most communication standards require the transmitted signal to meet a tight spectral mask. Typically, the signal needs to be filtered to meet the spectral requirements. Filtering can be achieved by using analog filter, digital filter, or a combination of both. Since it is harder and more expensive to implement sharp filters in analog circuits, most modern communication systems use digital filters to do most of the filtering work.

To achieve output that meets the required spectral mask, the input signal often needs to be interpolated to generate an output signal that is band limited in the frequency domain and smoothly shaped in the time domain. Interpolation is generally done by upsampling the signal by inserting points and then filtering it with a lowpass filter. Typically, 0's are inserted into the signal and then the upsampled, 0-inserted signal is convolved with the impulse response of a lowpass filter. The resulting output is band limited and smoothed.

FIG. 1 is a block diagram of a transmitter that includes upsampling and filtering. Input data 101 is encoded by encoder 102. The encoded signal is then upsampled by upsampler 103. The upsampled signal is then filtered by a finite impulse filter (FIR) 104 to produce a better shaped waveform at a higher frequency. The signal is then converted to an analog signal by a digital to analog converter (DAC) 105. Interpolator 106 includes the upsampler 103 and FIR 104. The output of DAC 105 is generally sent to a mixer and then transmitted.

FIG. 2A is a block diagram of one implementation of interpolator 106 in FIG. 1. The sampling rate of the input signal is increased to a higher frequency by upsampler 201. 0's are inserted in the upsampled points where original input values are not available. FIR filter 202 then filters the signal to make it band limited and smooth. In practice, when the filter is complex, its circuitry becomes large in area and therefore expensive. Also, because the large filter is running at the upsampled frequency, it consumes more power. It would desirable to have filter designs that would reduce area and power consumption.

FIG. 2B is a block diagram of a filter design that uses cascading upsamplers and filters to reduce circuitry area and power consumption. The signal is first upsampled to an intermediate frequency by first upsampler 211. The signal is then filtered by an FIR filter 212. Another upsampler 213 upsamples the signal and filter 215 again filters the signal until the desired output is achieved. Additional upsampling and filtering stages may be included. Such a cascading filter can achieve the same results as the one in FIG. 2A, but with smaller total area and power consumption. Although this design is an improvement, there is still a need for a system that provides a further reduction in area, complexity and power.

BRIEF DESCRIPTION OF THE DRAWINGS

The present invention will be readily understood by the following detailed description in conjunction with the accompanying drawings, wherein like reference numerals designate like structural elements, and in which:

FIG. 6 is a diagram illustrating how to obtain the front and end table sections.

DETAILED DESCRIPTION

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention are provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

Figure 1:
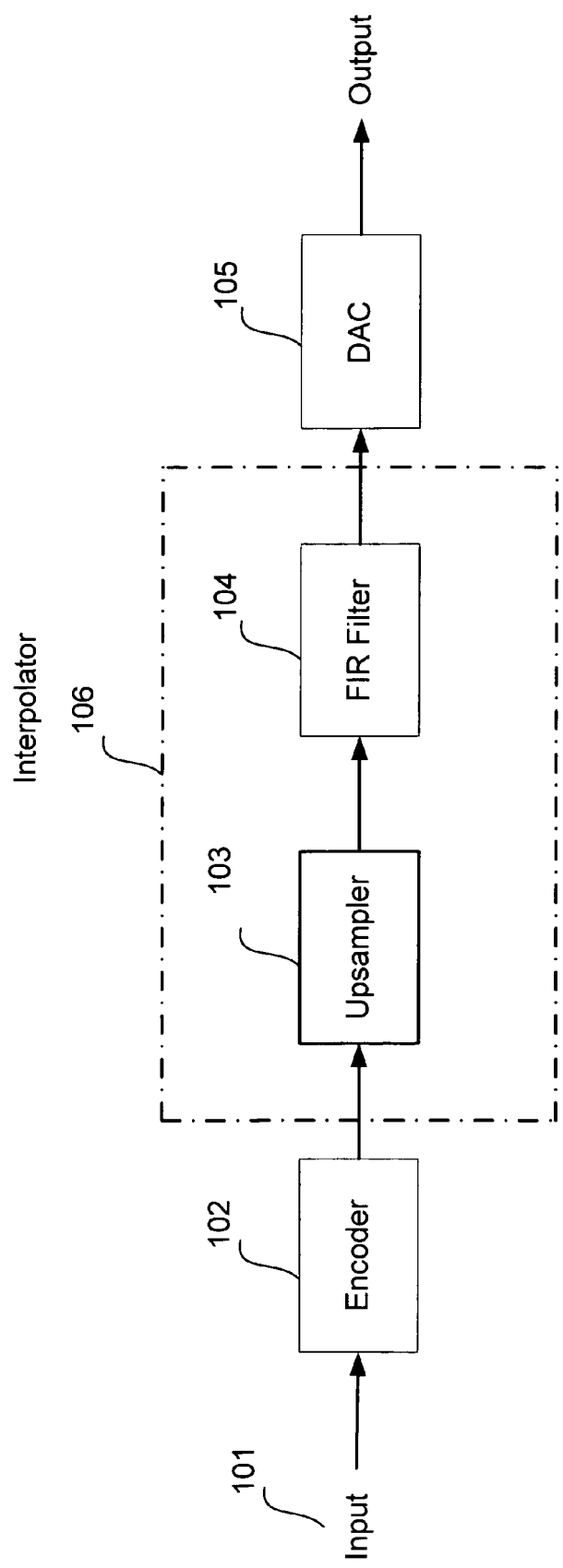
FIG. 1 is a block diagram of a transmitter that includes upsampling and filtering. Input data 101 is encoded by encoder 102.
Figure 2A:
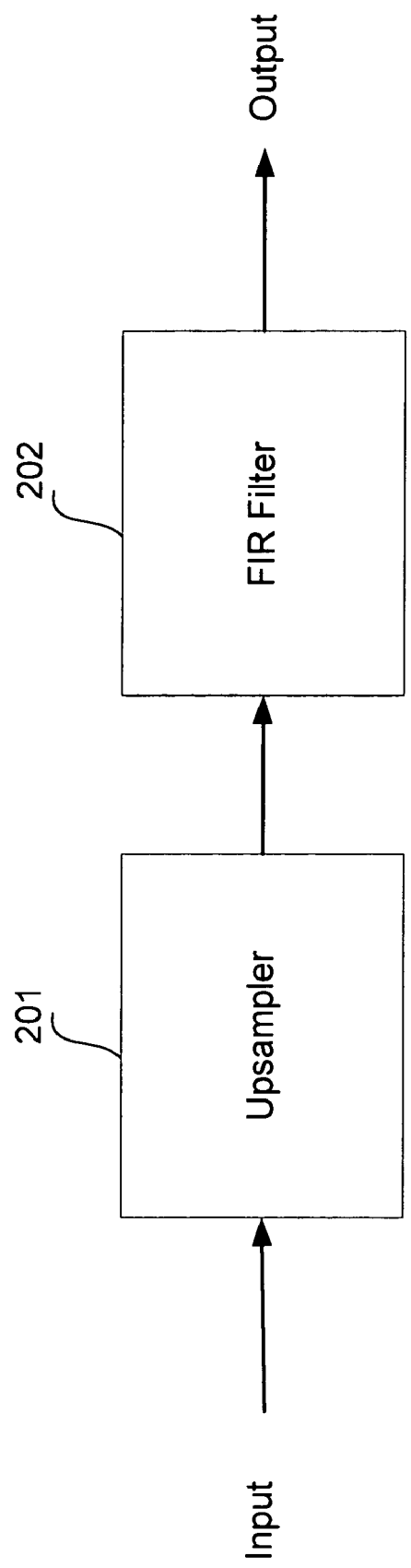
FIG. 2A is a block diagram of one implementation of interpolator 106 in FIG. 1.
Figure 2B:
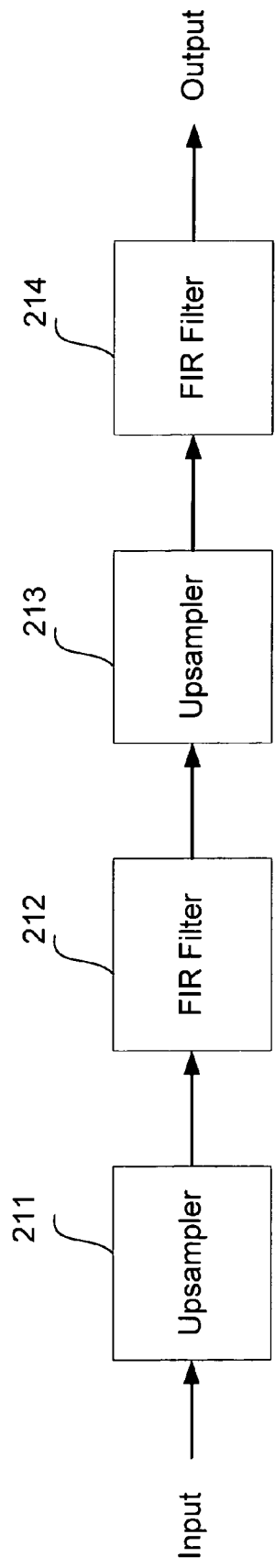
FIG. 2B is a block diagram of a filter design that uses cascading upsamplers and filters to reduce circuitry area and power consumption.

A digital filter design that uses one or more lookup tables is disclosed. The filter can be used to efficiently achieve interpolation of the input signal while reducing the required power and area. In one embodiment, upsampling and interpolation are achieved by looking up a plurality of output points for each input symbol. In one embodiment, input symbols are grouped into sets and the set of input symbols is used to determine the output using one or more look up tables (LUTs). In one embodiment, the LUT is generated by inputting combinations of the input symbols that are fed to an FIR filter that functions in a manner similar to the FIR filter(s) depicted in FIGS. 2A and 2B and noting the outputs. The input combinations and outputs are entered into the LUT.

Figure 3A:
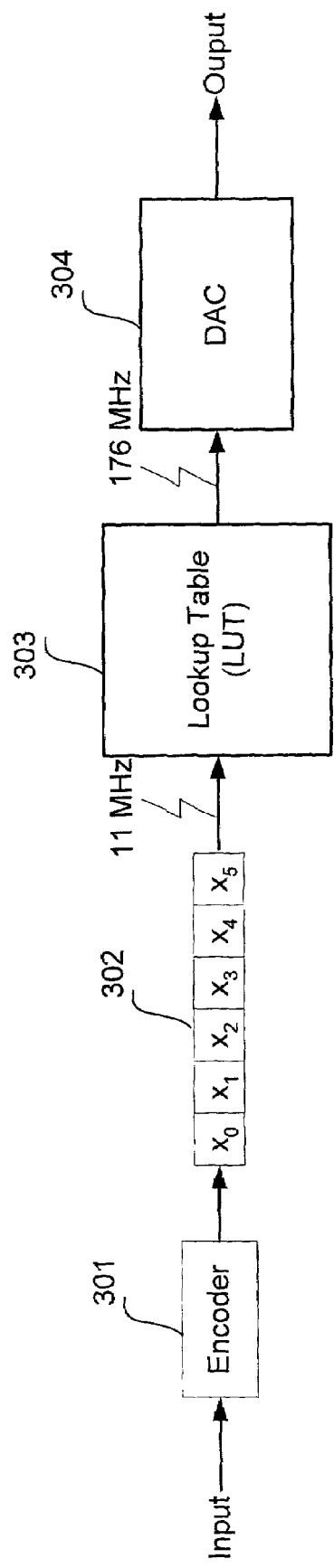
FIG. 3A is a block diagram of a transmitter that uses a LUT for upsampling and filtering.

FIG. 3A is a block diagram of a transmitter that uses a LUT for upsampling and filtering. In this embodiment, encoder 301 encodes the input data into a sequence of symbols. Because of interpolation, the each output sample is determined by a number of input symbols. The input symbols are grouped into a set and are stored in shift register 302. The grouped encoded input data is fed to LUT 303. The set of input symbols is used to look up the output entry in the LUT. In one embodiment, the output of each LUT based filter includes 512 levels (9 bits) and runs at the upsampled rate of 176 MHz. The resulting output is send to DAC 304, which converts the signal to analog signal for mixing and transmission. Other sampling rates and different number of levels are used in other embodiments. As is explained below, in certain applications, the lookup tables can be compressed based on the properties of the input signals and thus can be relatively small in area.

Figure 3B:
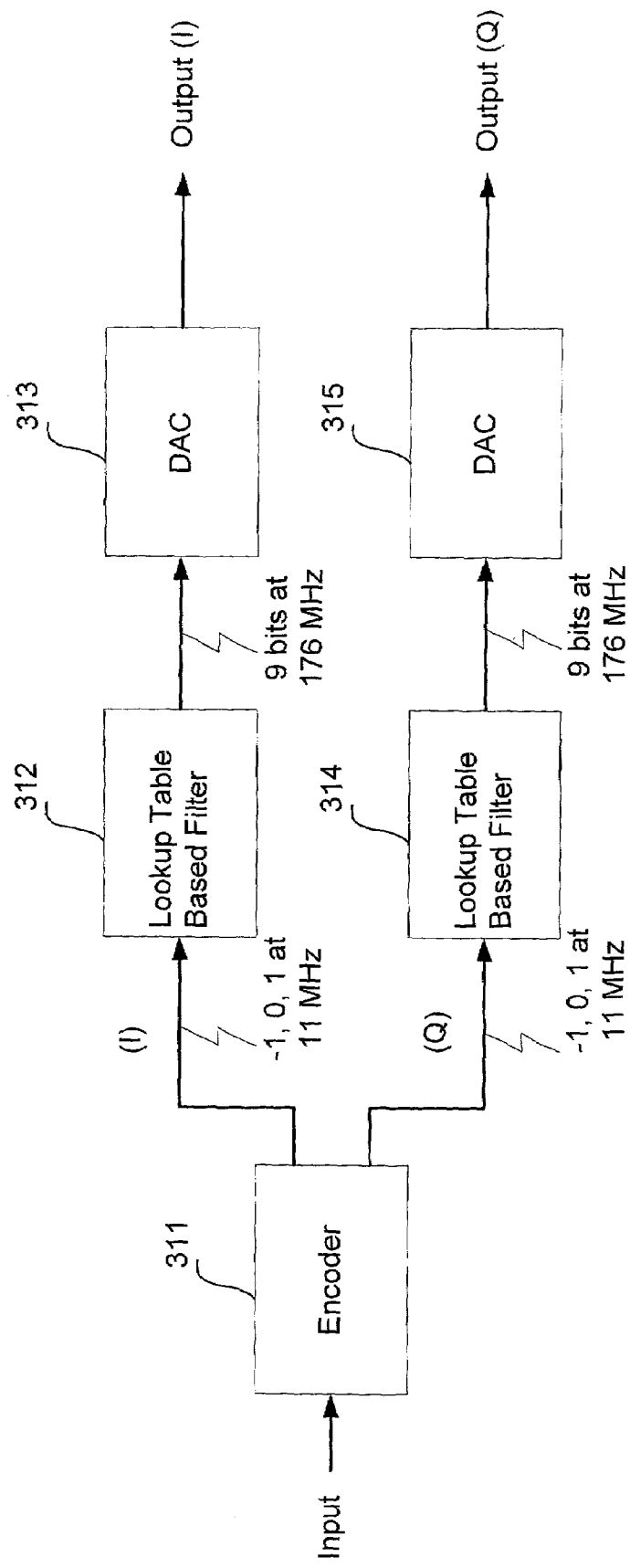
FIG. 3B illustrates a transmitter that uses LUTs to process a complex input signal.

In one embodiment, the input signal is split into I and Q components for processing. FIG. 3B illustrates a transmitter that uses LUTs to process a complex input signal. In this embodiment, the input is encoded by encoder 311, then split into I and Q components. The two signals are passed through lookup table based filters 312 and 314 and then fed to DACs 313 and 315. The two lookup table based filters can be identical. As described above, in one embodiment, the output of each LUT based filter includes 512 levels (9 bits) and runs at the upsampled rate of 176 MHz.

Figure 4A:
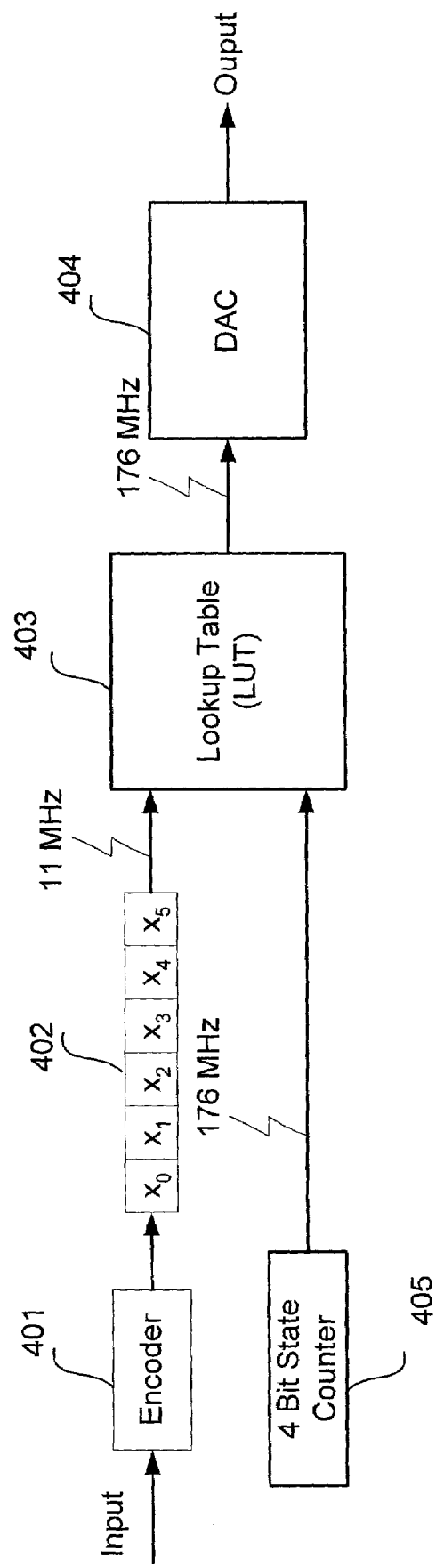
FIG. 4A illustrates a transmitter that includes a LUT that uses a state counter to help generate upsampled points.

FIG. 4A illustrates a transmitter that includes a LUT that uses a state counter to help generate upsampled points. In the following description, a transmitter design that meets IEEE 802.11b requirements is described. The encoded signal for 802.11b transmitter has only 3 levels in baseband (−1, 0, 1) at 11 MHz. Portions of the encoded signal that are not at the beginning or the end of a transmitted sequence include only 2 levels (−1,1). The LUT implementation is simplified by the fact that there are a limited number of possible input levels. The input is encoded by encoder 401. In the embodiment shown, due to the system requirements, a set of six input symbols $x_0$–$x_5$ are sufficient for determining the output and account for inter symbol interference. The input symbols are grouped and stored in shift register 402 running at an 11 MHz clock rate. The inputs are fed to LUT 403. State counter 405 running at a 176 MHz clock rate is also fed to the LUT.

In the embodiment described, during one input symbol clock cycle (91 ns), the state counter counts values 0 to 15, which together with the six input values, locates 16 outputs in the lookup table to generate the 16 interpolated output signal points at 176 MHz. Thus, the state counter increases the frequency that output samples are generated from the LUT. The output from the lookup table is then sent to DAC 404 to be converted to an analog signal. Note that in other systems, the number of encoded signal levels, the number of input symbols needed to determine the outputs, and the number of interpolated output signal points may vary.

Figure 4B:
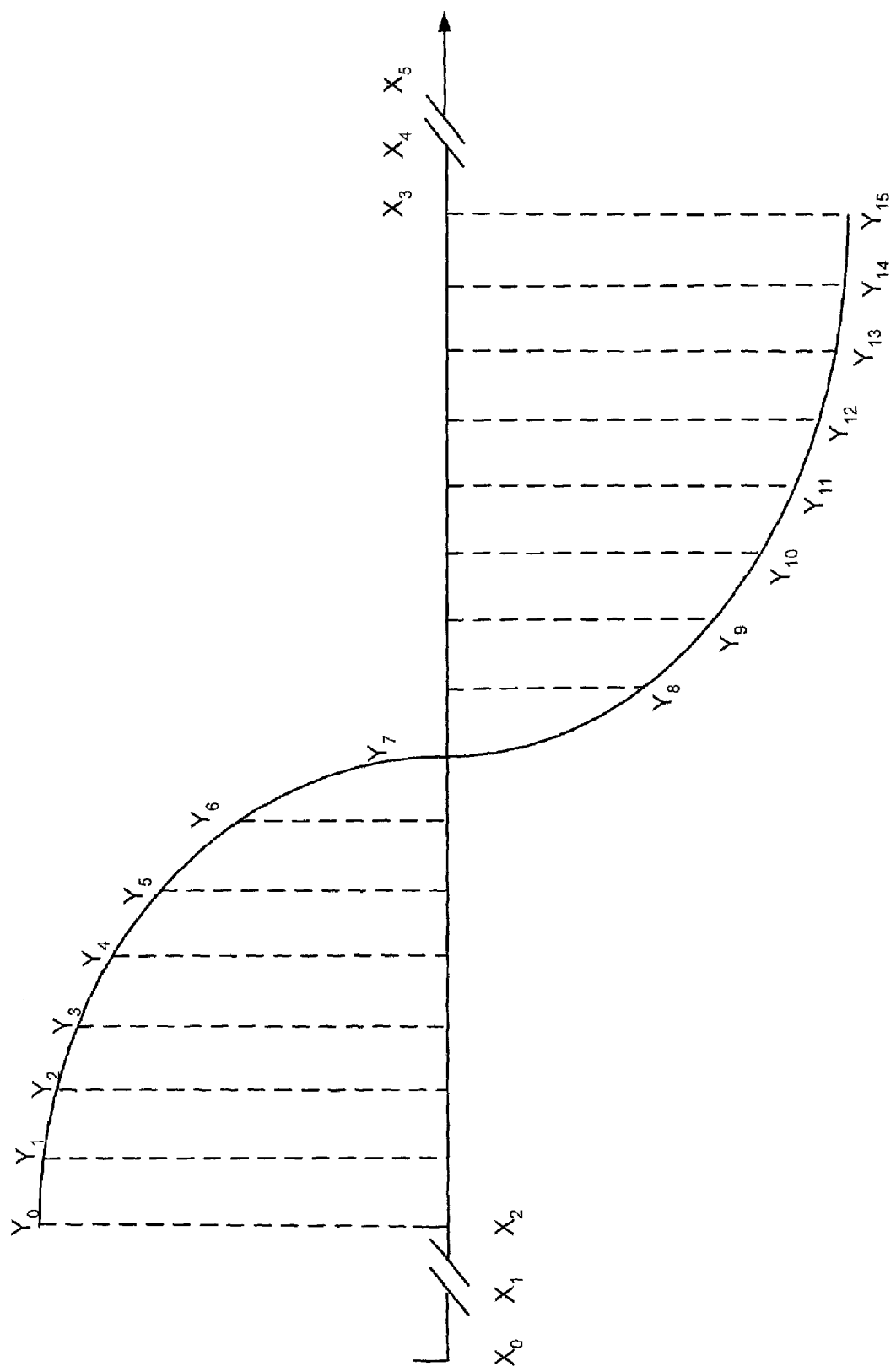
FIG. 4B illustrates the output of the system described in FIG. 4A.

FIG. 4B illustrates the output of the system described in FIG. 4A. The effects of up-sampling and interpolation in the time domain can be seen. In this embodiment, during one sampling period, 6 sampled input points $x_0$–$x_5$ on the x-axis (not to scale) determine the 16 time shifted, interpolated output values on the y-axis at $y_0$–$y_{15}$.

It should be noted that the implementation illustrated in FIG. 4A still requires the LUT to run at the upsampled frequency. Further power reduction may be achieved by splitting up the LUT into smaller LUTs and reducing the clock rate at which the LUTs run.

Figure 5A:
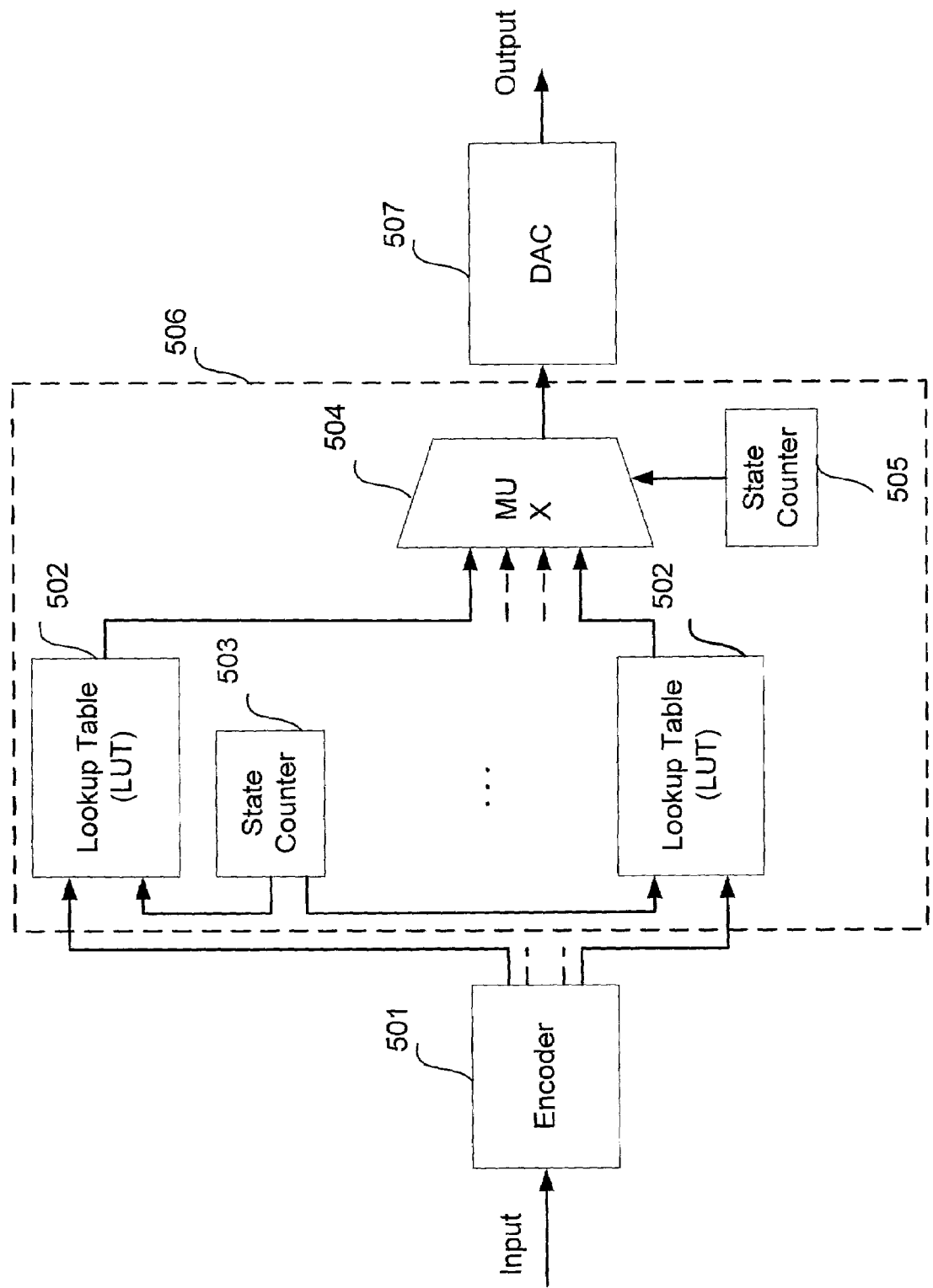
FIG. 5A is a block diagram of a transmitter that uses multiple LUTs to implement interpolation.

FIG. 5A is a block diagram of a transmitter that uses multiple LUTs to implement interpolation. In this embodiment, interpolator 506 includes N LUTs that generate outputs from input symbol sets. The input signal is encoded by encoder 501 and grouped using a shift register or other technique (not shown). The encoded input symbols are sent to N lookup tables 502. Each LUT shares the same state counter 503, which runs at a clock rate of the upsampled clock rate divided by N. Each LUT generates a subset of the upsampled output points. For example, if 16 output points are generated for each input point set and N=4, then each LUT generates every fourth point. N-to-1 multiplexer 504 sequentially selects outputs from the LUTs to generate consecutive output points. Thus, the outputs of the LUTs are interleaved by the multiplexer. The selection is done by state counter 505 which counts from 0 to (N−1), running at the upsampled frequency. The output of the multiplexer is converted by DAC 507 to analog for transmission. In this implementation, only the multiplexer is running at the upsampled frequency while the LUTs are running at a lower frequency, thereby reducing power consumption.

Figure 5B:
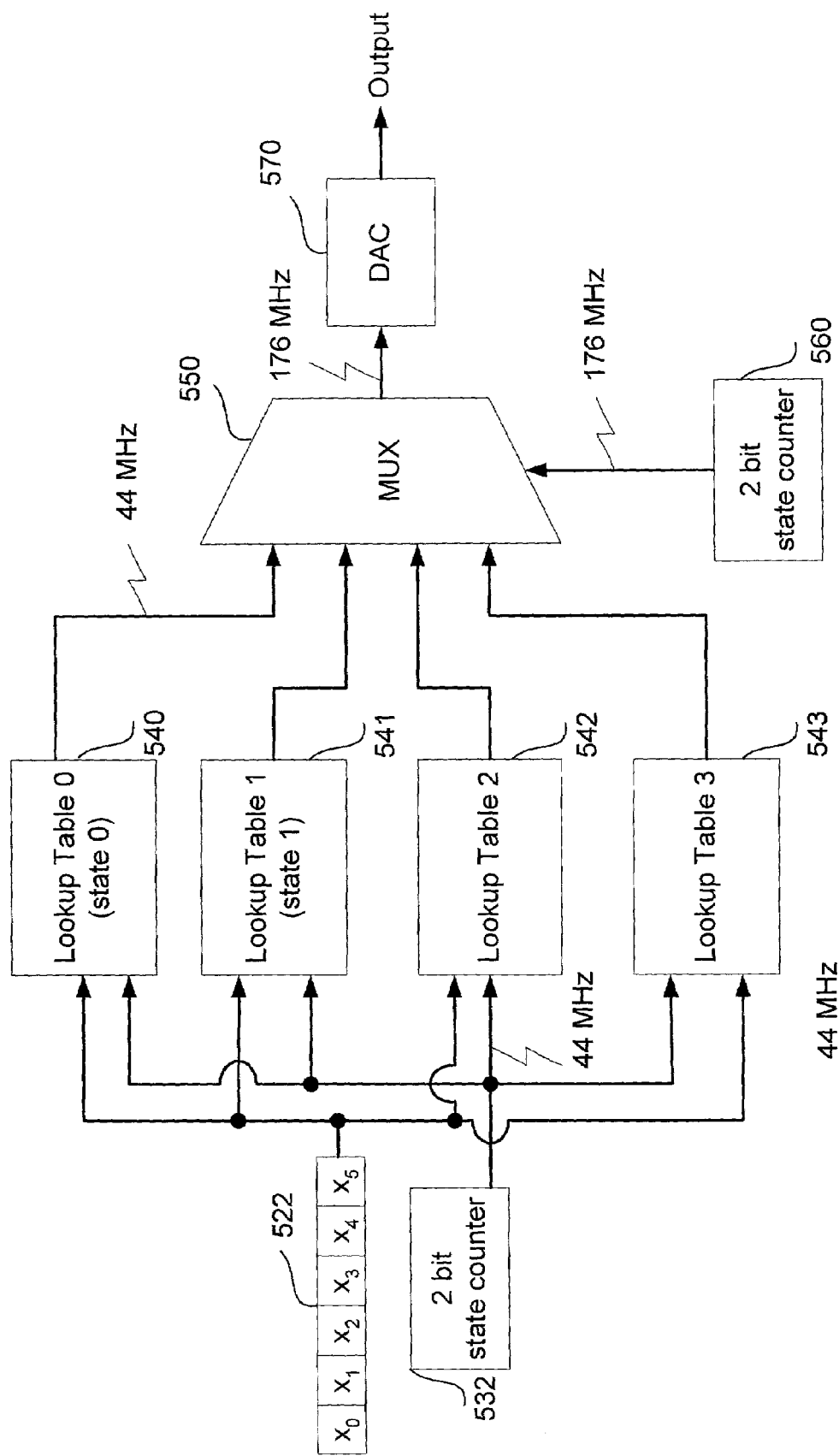
FIG. 5B illustrates an embodiment where multiple lookup tables are used in conjunction with a state counter running at an intermediate clock rate.

FIG. 5B illustrates an embodiment where multiple lookup tables are used in conjunction with a state counter running at an intermediate clock rate. The outputs of the lookup tables are then multiplexed at the upsampled rate to produce the desired result. The particular system is designed to satisfy the requirements of the IEEE 802.11b standard. The inputs $x_0$–$x_5$ are stored in shift register 520 running at the original clock rate of 11 MHz. There is a state counter 530 running at a 44 MHz clock rate. The overall lookup table for the system is split into four smaller tables 540, 541, 542, 543, where lookup table 0 contains entries for 4-to-1 multiplexer 550 at state 0; lookup table 1 contains entries for the multiplexer at state 1; lookup table 2 contains entries for the multiplexer at state 2; lookup table 3 contains entries for the multiplexer at state 3. The 4 states of multiplexer 550 are selected by another counter 560 that is running at a 176 MHz clock rate. The output of the multiplexer is the upsampled and interpolated data, which is fed to DAC 570 to be converted to an analog signal.

The above embodiments illustrate how power consumption is lowered by using multiple LUTs running at lower clock rate. Area reduction may be achieved by taking advantage of the properties of the input symbols when creating the LUTs. For example, in an embodiment that implements the IEEE 802.11b standard, the input has 3 levels and the output waveform is determined by 6 input symbols. With an up-sampling/interpolation factor of 16, the resulting table has $16*3^6=11664$ entries. However, the table size can be reduced by taking advantage of the input signal properties. The signal stays at a constant level of 0 at the beginning and the end of a packet, and has only two levels (−1 and 1) during the middle of a packet.

Three smaller table sections are generated based on the properties of the signal: front and end table sections for the signal at the beginning and end of a packet, and a center table section for the signal in the middle of the packet when it only has two levels. With two signal levels in the middle of the transmission and 16 interpolation points, the center table section has $16*2^6=1024$ entries.

FIG. 6 is a diagram illustrating how to obtain the front and end table sections. During the beginning and the end of the packet, parts of the shift register contain signals at level 0 and are fixed in the table entry calculation. Each x is a signal at level −1 or 1; the combinations of these signals are used to calculate the actual table entries. In this case, the number of entries in either a front or end table is 16*(2+4+8+16+32)=992. The number of entries in the three tables combined is 3008, which is much smaller than the original table. This technique may be applied to other systems having input signals with constant starting and ending signal levels. In other embodiments, the number of input symbols, the number of interpolation points and the number of entries in the table sections may vary.

A upsampling filter that reduces area, complexity and power has been disclosed. In one embodiment, the filter is used in an interpolator that upsamples and filters a discrete signal in one step using a LUT. The LUT may be implemented using several smaller LUTs running at a lower frequency combined with a multiplexer running at a higher frequency to further reduce power. The LUT may further be broken up into beginning, middle and end table sections to further reduce area and power.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method of processing a signal including: receiving encoded data including a plurality of input symbols; generating an input symbol set from the plurality of input symbols; looking up a plurality of output samples that correspond to a plurality of interpolated values of the input symbol set; and outputting the plurality of time shifted output samples; wherein looking up the plurality of output samples includes: finding the outputs in a plurality of lookup tables (LUTs); and selecting an appropriate LUT for a given output sample using a multiplexer.

2. A method of processing a signal as recited in claim 1 wherein the input symbol set includes six symbols.

3. A method of processing a signal as recited in claim 1 wherein looking up the plurality of output samples includes finding the outputs in a LUT having a plurality of entries and wherein the plurality of entries in the LUT correspond to time shifted output samples.

4. A method of processing a signal as recited in claim 1 wherein generating the input symbol set from the plurality of input symbols includes storing the input symbol set in a memory device.

5. A method of processing a signal as recited in claim 1 generating the input symbol set from the plurality of input symbols includes storing the input symbol set in a memory device and wherein looking up the plurality of output samples includes finding the outputs in a LUT.

6. A method of processing a signal as recited in claim 1 wherein the plurality of input symbol sets are split into I and Q components and the I and Q components are used as inputs to separate LUTs to obtain the plurality of output samples.

7. A method of processing a signal as recited in claim 1 wherein the plurality of output samples comprise a band limited signal.

8. A method of processing a signal as recited in claim 1 wherein looking up the plurality of output samples includes finding the outputs in a LUT and wherein the LUT includes a beginning section and an ending section.

9. A method of processing a signal as recited in claim 1 wherein looking up the plurality of output samples includes finding the outputs in a LUT and wherein the LUT includes a beginning section, a middle section and an ending section.

10. A method of processing a signal as recited in claim 1 wherein looking up the plurality of output samples includes finding the outputs in a LUT and wherein the LUT is compressed.

11. A method of processing a signal as recited in claim 1 wherein looking up the plurality of output samples includes finding the outputs in a LUT and wherein the LUT excludes certain potential input sets.

12. A method of processing a signal as recited in claim 1 wherein the plurality of LUTs are used in conjunction with a state counter.

13. A method of processing a signal as recited in claim 1 wherein looking up the plurality of output samples includes:
finding possible output samples in a plurality of LUTs using a first state counter; and
selecting the output samples from the possible output samples using a multiplexer and a second state counter.

14. A method of processing a signal as recited in claim 1, further comprising encoding a plurality of inputs to generate the encoded data.

15. A method of processing a signal as recited in claim 1 wherein the plurality of input symbols has a lower clock rate than the plurality of output samples.

16. A method of processing a signal including: receiving encoded data including a plurality of input symbols; generating an input symbol set from the plurality of input symbols; looking up a plurality of output samples that correspond to a plurality of interpolated values of the input symbol set; and outputting the plurality of time shifted output samples; wherein looking up the plurality of output samples includes finding the outputs in a plurality of lookup tables (LUTs) each having a plurality of entries and wherein the plurality of entries in each of the plurality of LUTs corresponds to interleaved output samples.

17. A system for processing a signal including: an input for receiving encoded data including a plurality of input symbols; symbols; a first memory for storing an input symbol set derived from the plurality of input a second memory configured to store a plurality of interpolated time shifted output samples; wherein the plurality of time shifted output samples are obtained by looking up the input symbol set; and wherein the second memory includes a plurality of lookup tables (LUTs) having a plurality of LUT outputs, and a multiplexer configured to select one of the plurality LUT outputs.

18. A system for processing a signal as recited in claim 17 wherein the input symbol set includes six symbols.

19. A system for processing a signal as recited in claim 17 wherein the second memory includes a LUT having a plurality of entries and wherein the plurality of entries in the LUT correspond to time shifted output samples.

20. A system for processing a signal as recited in claim 17 wherein the first memory includes a shift register.

21. A system for processing a signal as recited in claim 17 wherein the first memory includes a shift register and the second memory includes a LUT.

22. A system for processing a signal as recited in claim 17 wherein the selected one of the plurality of outputs results in a band limited signal.

23. A system for processing a signal as recited in claim 17 wherein the second memory includes a LUT and wherein the LUT includes a beginning section and an ending section.

24. A system for processing a signal as recited in claim 17 wherein the second memory includes a LUT and the LUT includes a beginning section, a middle section and an ending section.

25. A system for processing a signal as recited in claim 17 wherein the second memory includes a LUT and wherein the LUT is compressed.

26. A system for processing a signal as recited in claim 17 wherein the second memory includes a LUT and wherein the LUT excludes certain potential input sets.

27. A system for processing a signal as recited in claim 17 wherein the plurality of LUTs are used in conjunction with a state counter.

28. A system for processing a signal as recited in claim 17 wherein the second memory includes:
   a plurality of LUTs having a first state counter for selecting outputs from the plurality of LUTs;
   a multiplexer for selecting one of the plurality of LUTs using a second state counter.

29. A system for processing a signal as recited in claim 17 wherein the input symbol set includes I and Q components and wherein the second memory is configured to store a plurality of outputs for possible I and Q components of the input symbol set and wherein the second memory is configured to output selected I and Q component outputs that correspond to the I and Q components of the input symbol set.

30. A system for processing a signal as recited in claim 17 further comprising a processor configured to encode a plurality of inputs to generate the encoded data.

31. A system for processing a signal as recited in claim 17 wherein the plurality of input symbols has a lower clock rate than the plurality of output samples.

32. A system for processing a signal including: an input for receiving encoded data including a plurality of input symbols; a first memory for storing an input symbol set derived from the plurality of input symbols; a second memory configured to store a plurality of interpolated output samples; wherein the plurality of time shifted output samples are obtained by looking up the input symbol set; and wherein the second memory includes a plurality of lookup tables (LUTs) and wherein the entries in each of the plurality of LUTs corresponds to interleaved output samples.

* * * * *

UNITED STATES PATENT AND TRADEMARK OFFICE
CERTIFICATE OF CORRECTION

PATENT NO. : 7,185,036 B1 Page 1 of 1
APPLICATION NO. : 10/139654
DATED : February 27, 2007
INVENTOR(S) : Wang et al.

It is certified that error appears in the above-identified patent and that said Letters Patent is hereby corrected as shown below:

Claim 17
Colum 6, line 44 delete "input symbols; symbols; a first memory for storing an input symbol set derived from the plurality of input a second" and insert -- input symbols; a first memory for storing an input symbol set derived from the plurality of input symbols; a second --

Signed and Sealed this

Eighth Day of September, 2009

David J. Kappos
*Director of the United States Patent and Trademark Office*